United States Patent
Strong et al.

(10) Patent No.: US 10,044,302 B2
(45) Date of Patent: Aug. 7, 2018

(54) METHODS AND APPARATUS FOR MULTI-MODE MOTOR SPEED CALCULATION USING DIGITAL HALL EFFECT SENSORS

(71) Applicant: HONEYWELL INTERNATIONAL INC., Morris Plains, NJ (US)

(72) Inventors: Ron Strong, Phoenix, AZ (US); Thom Kreider, Peoria, AZ (US)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 0 days.

(21) Appl. No.: 15/622,915

(22) Filed: Jun. 14, 2017

(65) Prior Publication Data
US 2018/0198389 A1    Jul. 12, 2018

Related U.S. Application Data

(60) Provisional application No. 62/443,072, filed on Jan. 6, 2017.

(51) Int. Cl.
*H02K 29/08*    (2006.01)
*H02P 6/17*    (2016.01)
(Continued)

(52) U.S. Cl.
CPC ............... *H02P 6/17* (2016.02); *G01P 3/486* (2013.01); *G01P 3/489* (2013.01); *G01R 33/072* (2013.01)

(58) Field of Classification Search
CPC ...... H02P 1/00; H02P 3/00; H02P 5/00; H02P 6/00; H02P 7/00; H02P 21/00; H02P 6/14;
(Continued)

(56) References Cited

U.S. PATENT DOCUMENTS 4,799,178 A    1/1989    Spadafora et al.
6,496,786 B1    12/2002    Dieterle et al.
(Continued)

FOREIGN PATENT DOCUMENTS

EP    0094492 A2    11/1983

OTHER PUBLICATIONS

Gamazo-Real, Jose Carlos, et al., "Position and Speed Control of Brushless DC Motors Using Sensorless Techniques and Application Trends," Sensors, Jul. 19, 2010, ISSN 1424-8220, www.mdpi.com/journal/sensors.
(Continued)

*Primary Examiner* — Antony M Paul
(74) *Attorney, Agent, or Firm* — Lorenz & Kopf, LLP (57) ABSTRACT

A method for determining an updated rotor speed for a motor is provided. The method obtains, by a processor, a current rotor speed of the motor; determines a current mode for the motor, based on the current rotor speed, wherein the current mode comprises a low-speed mode, an intermediate speed mode, or a high-speed mode; detects one or more Hall events associated with a plurality of digital Hall Effect sensors coupled to the motor, based on the current mode; calculates, by the processor, a new rotor speed for the motor, based on the one or more Hall events and the current mode; and transmits the new rotor speed as a motor speed feedback signal, for digital speed control of the motor.

20 Claims, 4 Drawing Sheets

(51) Int. Cl.
  *G01P 3/489* (2006.01)
  *G01P 3/486* (2006.01)
  *G01R 33/07* (2006.01)

(58) Field of Classification Search
  CPC ......... H02P 27/04; H02P 27/06; H02K 29/06; H02K 29/08; H02K 29/14
  USPC ... 318/11, 595, 55, 59, 66, 68, 69, 146, 157, 318/163, 167, 700, 701, 727, 779, 799, 318/800, 801, 280, 286, 266, 490, 504, 318/599, 811, 400.37, 400.38; 388/800, 388/904, 909
  See application file for complete search history.

(56) References Cited

U.S. PATENT DOCUMENTS

| | | | |
|---|---|---|---|
| 6,580,235 B2* | 6/2003 | Laurent | H02P 6/085 318/400.1 |
| 6,701,275 B1 | 3/2004 | Muratomi | |
| 7,328,122 B2 | 2/2008 | Courtney | |
| 7,332,884 B2* | 2/2008 | Rozman | F02C 7/275 318/432 |
| 9,660,559 B2* | 5/2017 | Kimura | H02P 6/08 |
| 2003/0164692 A1 | 9/2003 | Grand et al. | |
| 2004/0251894 A1 | 12/2004 | Scotson et al. | |
| 2008/0255796 A1 | 10/2008 | Takeuchi | |

OTHER PUBLICATIONS

Extended EP Search Report for Application No. 18150385.5 dated May 24, 2018.

\* cited by examiner

METHODS AND APPARATUS FOR MULTI-MODE MOTOR SPEED CALCULATION USING DIGITAL HALL EFFECT SENSORS

CROSS-REFERENCE TO RELATED APPLICATION(S)

This application claims the benefit of U.S. provisional patent application Ser. No. 62/443,072, filed Jan. 6, 2017.

TECHNICAL FIELD

Embodiments of the subject matter described herein relate generally to calculating motor speed, and more particularly, to using digital Hall Effect sensor events and speed thresholds to calculate motor speed.

BACKGROUND

The speed feedback update rate for a direct current (DC) motor is dependent on the speed of the motor. Hall Effect sensor transition events may be used for such speed determination. Hall Effect sensor transition events are not periodic, but the feedback is often used by a periodic digital controller. Thus, depending on the speed of the motor, the controller sample rate may be incompatible with the update rate of the derived speed measurement. Sensor noise may also be an issue.

Accordingly, it is desirable to provide additional methods for speed determination. Furthermore, other desirable features and characteristics will become apparent from the subsequent detailed description and the appended claims, taken in conjunction with the accompanying drawings and the foregoing technical field and background.

BRIEF SUMMARY

Some embodiments of the present disclosure provide a method for determining an updated rotor speed for a motor. The method obtains, by a processor, a current rotor speed of the motor; determines a current mode for the motor, based on the current rotor speed, wherein the current mode comprises a low-speed mode, an intermediate speed mode, or a high-speed mode; detects, based on the current mode, one or more Hall events associated with a plurality of digital Hall Effect sensors coupled to the motor; calculates, by the processor, a new rotor speed for the motor, based on the one or more Hall events and the current mode; and transmits the new rotor speed as a motor speed feedback signal, for digital speed control of the motor.

Some embodiments of the present disclosure provide a system for determining an updated rotor speed for a motor, the motor comprising a permanent magnet synchronous motor comprising rotor magnets. The system includes a system memory element; a plurality of digital Hall effect sensors, configured to detect one or more Hall events associated with the plurality of digital Hall effect sensors during rotation of the motor; and at least one processor, communicatively coupled to the system memory element and the plurality of Hall effect sensors, the at least one processor configured to: obtain a current rotor speed of the motor; determine a current mode for the motor, based on the current rotor speed, wherein the current mode comprises a low-speed mode, an intermediate speed mode, or a high-speed mode; detect, based on the current mode, the one or more Hall events, via the plurality of digital Hall Effect sensors; calculate a new rotor speed for the motor, based on the one or more Hall events and the current mode; and transmit the new rotor speed as a motor speed feedback signal, for digital speed control of the motor.

Some embodiments of the present disclosure provide a non-transitory, computer-readable medium containing instructions thereon, which, when executed by a processor, perform a method. The method determines a current mode for a motor, based on a current rotor speed, wherein the current mode comprises a low-speed mode, an intermediate speed mode, or a high-speed mode, and wherein the motor comprises a currently rotating permanent magnet synchronous motor; detects one or more polarity changes associated with a plurality of digital Hall Effect sensors coupled to the motor, based on the current mode; calculates a new rotor speed for the motor, based on the one or more polarity changes and the current mode; and transmits the new rotor speed as a motor speed feedback signal, for digital speed control of the motor.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

The subject matter presented herein relates to apparatus and methods for determining motor speed feedback over a large operational range useful for digital speed control, by using a multi-mode speed calculation that provides feedback signals appropriate for each speed range. More specifically, the subject matter relates to providing a large number of updates per motor revolution at low speeds, while providing less noise in the speed estimate at high speeds.

Certain terminologies are used with regard to the various embodiments of the present disclosure. A six-step, brushless, direct current (DC) motor is a Permanent Magnet Synchronous Motor (PMSM) or a Permanent Magnet AC (PMAC) motor, for example, and functions to rotate at a constant angular velocity. A digital Hall Effect sensor is a transducer that varies its output voltage in response to a magnetic field. A polarity change, detected by a digital Hall Effect sensor, occurs when the detected polarity of the plurality of rotor magnets of the motor alternates. The rotor magnets are positioned according to alternating polarity, and the detected pole alternates as multiple rotor magnets with alternating polarity pass in front of the Hall Effect sensor. A mechanical revolution of a permanent magnet synchronous motor is a complete physical rotation of the rotor. One mechanical revolution of the permanent magnet synchronous motor may include n-electrical revolutions, wherein n is the number of magnet pairs of the permanent magnet synchronous motor.

Figure 1:
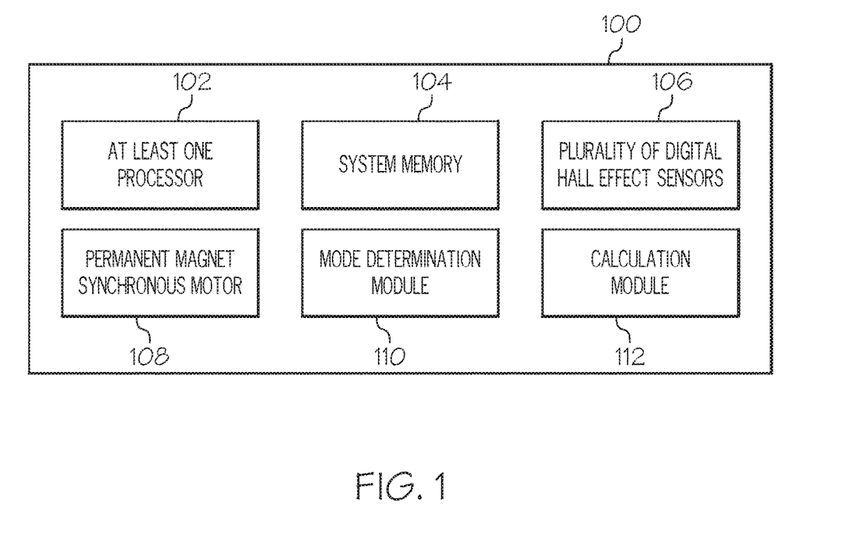
FIG. 1 is a functional block diagram of a speed determination system, in accordance with the disclosed embodiments.

Turning now to the figures, FIG. 1 is a functional block diagram of a speed determination system 100, in accordance with the disclosed embodiments. The speed determination system 100 is generally used to update a speed calculation for a feedback signal associated with a permanent magnet synchronous motor. The speed determination system 100 generally includes, without limitation, at least one processor 102; some form of system memory 104; a plurality of digital Hall Effect sensors 106; a permanent magnet synchronous motor 108; a mode determination module 110; and a calculation module 112. These elements and features of speed determination system 100 may be operatively associated with one another, coupled to one another, or otherwise configured to cooperate with one another as needed to support the desired functionality—in particular, updating feedback signal associated with the speed of a permanent magnet synchronous motor, as described herein. For ease of illustration and clarity, the various physical, electrical, and logical couplings and interconnections for these elements and features are not depicted in FIG. 1. Moreover, it should be appreciated that embodiments of the speed determination system 100 will include other elements, modules, and features that cooperate to support the desired functionality. For simplicity, FIG. 1 only depicts certain elements that relate to the speed determination techniques described in more detail below.

The at least one processor 102 may be implemented or performed with one or more general purpose processors, a content addressable memory, a digital signal processor, an application specific integrated circuit, a field programmable gate array, any suitable programmable logic device, discrete gate or transistor logic, discrete hardware components, or any combination designed to perform the functions described herein. In particular, the at least one processor 102 may be realized as one or more microprocessors, controllers, microcontrollers, or state machines. Moreover, the at least one processor 102 may be implemented as a combination of computing devices, e.g., a combination of digital signal processors and microprocessors, a plurality of microprocessors, one or more microprocessors in conjunction with a digital signal processor core, or any other such configuration.

The at least one processor 102 communicates with system memory 104. System memory 104 may be realized using any number of devices, components, or modules, as appropriate to the embodiment. Moreover, the speed determination system 100 could include system memory 104 integrated therein and/or system memory 104 operatively coupled thereto, as appropriate to the particular embodiment. In practice, the system memory 104 could be realized as RAM memory, flash memory, EPROM memory, EEPROM memory, registers, a hard disk, a removable disk, or any other form of storage medium known in the art. In certain embodiments, the system memory 104 includes a hard disk, which may also be used to support functions of the speed determination system 100. The system memory 104 can be coupled to the at least one processor 102 such that the at least one processor 102 can read information from, and write information to, the system memory 104. In the alternative, the system memory 104 may be integral to the at least one processor 102. As an example, the at least one processor 102 and the system memory 104 may reside in a suitably designed application-specific integrated circuit (ASIC).

Figure 2:
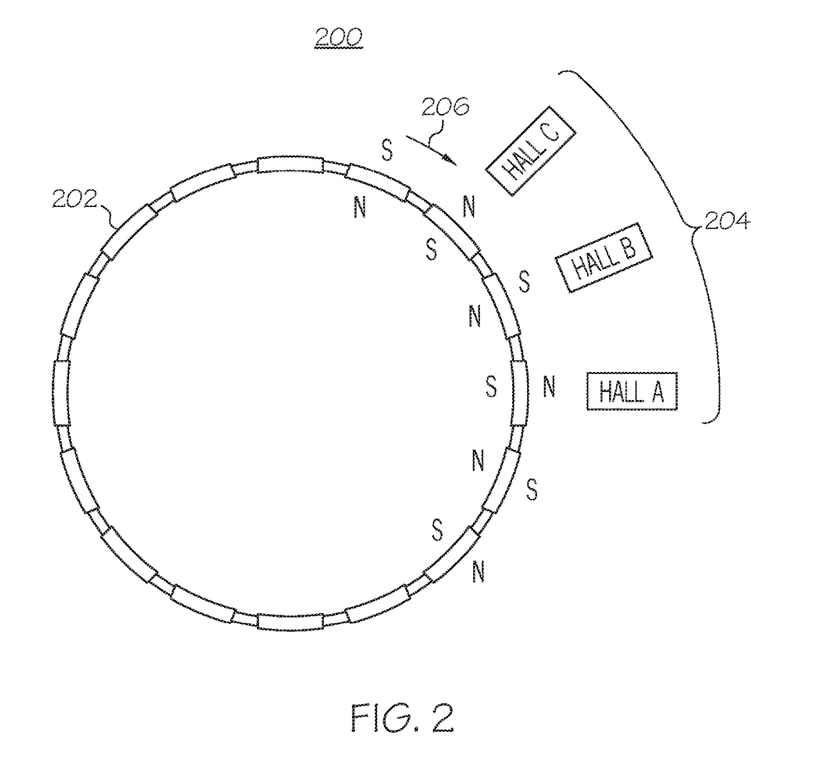
FIG. 2 is a diagram of a permanent magnet synchronous motor and digital Hall Effect sensors, in accordance with the disclosed embodiments.

The plurality of digital Hall Effect sensors 106 are positioned within a defined proximity of the permanent magnet synchronous motor 108, and are configured to provide an output voltage (as shown in FIG. 2) associated with magnet polarity. The output voltage of the plurality of digital Hall Effect sensors 106 is "high" or "low" based on detected polarity changes of the permanent magnet synchronous motor 108. Each change of the output voltage from high to low, or low to high, may be referred to as a "Hall event" or a "Hall Effect transition event". During rotation of the permanent magnet synchronous motor 108, time differences between Hall events may be obtained and used by the calculation module 112 to calculate accurate speed for the permanent magnet synchronous motor 108.

The permanent magnet synchronous motor 108 may be implemented using a Permanent Magnet Synchronous Motor (PMSM) or a Permanent Magnet AC (PMAC) motor, which is often controlled using a Field Oriented Control (FOC) scheme. The permanent magnet synchronous motor 108 is operable to rotate at a predetermined angular velocity such that the mode determination module 110 and the calculation module 112 function to determine a time difference between particular Hall events (the Hall events generated by the plurality of digital Hall Effect sensors 106) and calculate an accurate motor speed using the current mode of the permanent magnet synchronous motor 108.

The mode determination module 110 is configured to identify a current speed-mode of the permanent magnet synchronous motor 108, based on a currently calculated speed of the permanent magnet synchronous motor 108 (obtained via the calculation module 112). Generally, the currently calculated speed is part of a feedback loop, and is provided by the calculation module 112 such that the mode determination module 110 can identify the current speed-mode. The mode may be a low-speed mode, an intermediate speed mode, or a high-speed mode, and the mode determination module 110 uses predetermined speed thresholds to identify the current mode.

The calculation module 112 is configured to compute an accurate speed of the permanent magnet synchronous motor 108, based on the current mode and the Hall events detected by the plurality of digital Hall Effect sensors 106 coupled to the permanent magnet synchronous motor 108. When the motor is operating in a low-speed mode, the calculation module 112 uses sequential Hall events occurring during a single electrical revolution of the motor to calculate an accurate speed. Each sequential "pairing" of Hall state changes in one electrical revolution, used for the low-speed mode, is produced by two (2) separate and distinct Hall Effect sensors. When the motor is operating in an intermediate-speed mode, the calculation module 112 uses a first Hall event associated with a first electrical revolution and a second Hall event associated with a second electrical revolution. In the intermediate-speed mode, an entire electrical revolution passes between relevant Hall events. There are fewer relevant Hall events than that detected in the low-speed mode, thus reducing signal noise during intermediate-level speeds of the motor. When the motor is operating in a high-speed mode, the calculation module 112 uses a first Hall event occurring during a first mechanical revolution and a second Hall event occurring during a second sequential mechanical revolution of the motor. Here, an entire mechanical revolution passes between relevant Hall events. The number of relevant Hall events is less than that detected in the intermediate-speed mode, thus reducing signal noise more than the reduction in signal noise that occurs during operation in the intermediate-speed mode.

The Hall transition events are not periodic and the speed feedback update rate is dependent on the speed of the motor. Since the feedback is generally used by a periodic digital controller, the update rate (i.e., the rate at which Hall events are sampled) of the derived speed measurement eventually becomes lower than the sample rate of the controller. Further, at high speeds, the number of updates is significantly larger than the sample rate, but sensor noise is introduced due to manufacturing variances in motor magnet placement. However, by using the appropriate speed-mode of the permanent magnet synchronous motor 108 (provided by the mode determination module 110), the calculation module 112 samples a greater number of Hall transition events at low speeds and a lesser number of Hall transition events at high speeds, thereby increasing the sample rate at low speeds and reducing noise at high speeds. The newly-calculated, accurate speed value may then be used as a motor speed feedback signal for digital speed control of the permanent magnet synchronous motor 108.

In practice, the mode determination module 110 and/or the calculation module 112 may be implemented with (or cooperate with) the at least one processor 102 to perform at least some of the functions and operations described in more detail herein. In this regard, the mode determination module 110 and/or the calculation module 112 may be realized as suitably written processing logic, application program code, or the like.

FIG. 2 is a diagram of a structure 200 that includes a permanent magnet synchronous motor 202 and a plurality of digital Hall Effect sensors 204, in accordance with the disclosed embodiments. It should be noted that the structure 200 can be implemented with the permanent magnet synchronous motor 108 and the plurality of digital Hall Effect sensors 106 depicted in FIG. 1. In this regard, the structure 200 shows certain elements and components of the permanent magnet synchronous motor 108 and the plurality of digital Hall Effect sensors 106 in more detail. Further, it should be appreciated that FIG. 2 depicts a simplified embodiment of the structure 200, and that some implementations of the structure 200 may include additional elements or components, as desired for the particular application. For example, additional components such as computing devices, displays, and/or user input components may be employed without departing from the scope of the present disclosure.

As shown, the permanent magnet synchronous motor 202 includes a plurality of magnets positioned around the circumference of the motor 202, and the magnets are positioned such that each magnet presents an opposite polarity of the magnet immediately to the left and right of the first magnet. Thus, the magnets alternate in polarity around the circumference of the motor 202. Polarity change 206 illustrates the transition, at Hall Effect sensor "Hall C", from a detected "south" polarity to a "north" polarity, when the motor 202 rotates in a clockwise direction. The plurality of digital Hall Effect sensors 204 are positioned outside of the permanent magnet synchronous motor 202.

During operation, the permanent magnet synchronous motor 202 rotates, and each of the magnets, with alternating polarity, passes within proximity of the digital Hall Effect sensors 204 during this rotation. The technique is to identify whether the motor 202 is operating in a low-speed mode, an intermediate-speed mode, or a high-speed mode, based on a current detected speed of the motor, and to detect Hall transition events, generated by the plurality of digital Hall Effect sensors 204, based on the identified mode. An accurate motor speed value is then calculated, based on the detected Hall transition events. The new motor speed value may be used as a motor speed feedback signal by a speed controller, for digital speed control of the motor.

Figure 3:
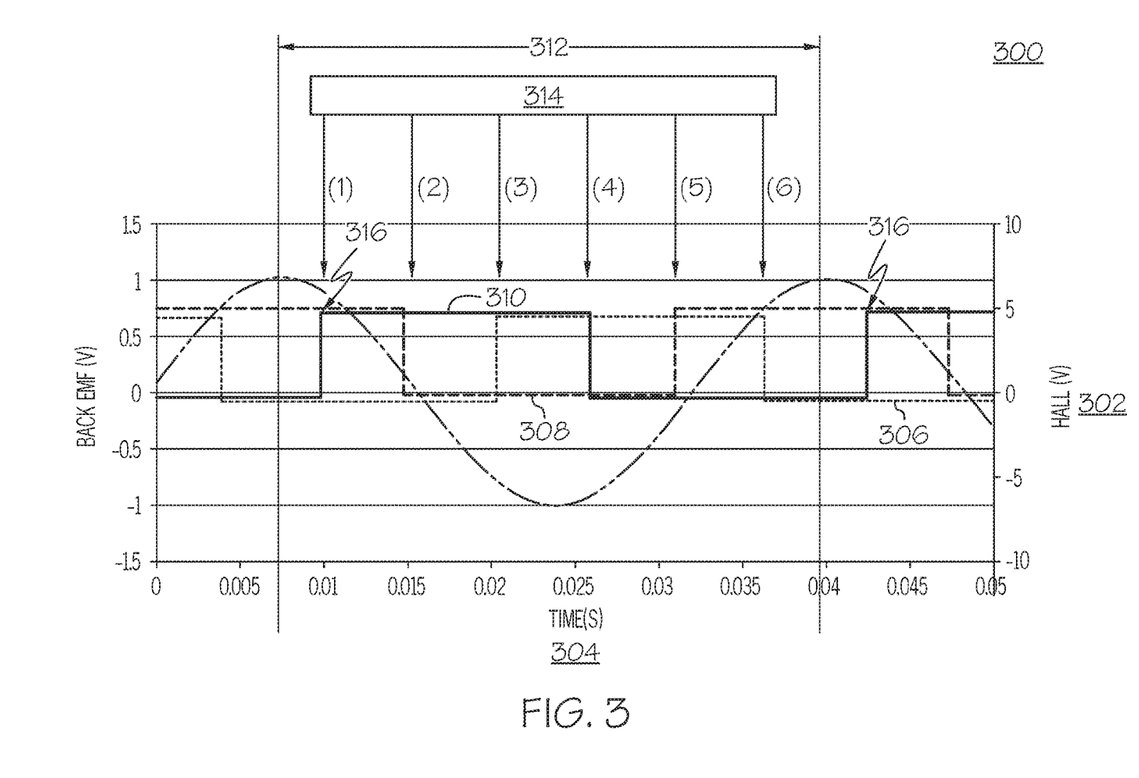
FIG. 3 is a plot illustrating events occurring during one electrical revolution of the permanent magnet synchronous motor.

FIG. 3 is a plot 300 illustrating events occurring during one electrical revolution 312 of a permanent magnet synchronous motor with twenty-two (22) poles and that is coupled to three (3) Hall Effect sensors. The plot 300 shows the output voltage 302 of three Hall Effect sensors versus time 304, in the form of output voltage signals 306, 308, 310. As shown, for output voltage signal 310, there is one rising edge per electrical revolution (see reference 316). There are six (6) Hall state changes 314 per electrical revolution 312, and each Hall state change may also be referred to as a polarity change, a Hall event, a Hall transition, or the like. Each Hall state change is associated with 60 degrees of an electrical revolution, wherein one electrical revolution comprises 360 degrees. Each of the Hall state changes 314 is a rising or falling edge of the output voltage signals 306, 308, 310, indicating that a Hall state change (i.e., a hall Event 314) is an abrupt shift from a 5 volt (V) output signal to a 0V output signal, or from a 0V output signal to a 5V output signal.

In this example, the motor includes twenty-two (22) poles and is coupled to three (3) Hall Effect sensors. One mechanical revolution of the motor includes sixty-six (66) Hall state changes (22 poles×3 Hall sensors=66 Hall transitions). There are six (6) Hall state changes in an electrical revolution of the motor, and there are sixty-six (66) Hall state changes in a mechanical revolution of the motor. Thus, there are eleven (11) electrical revolutions per mechanical revolution (66 Hall transitions per mechanical revolution/6 Hall transitions per electrical revolution=11 electrical revolutions per mechanical revolution).

In this exemplary embodiment, a motor speed feedback value is determined, over a large operational range useful for digital speed control, by using a multi-mode speed calculation that provides a motor speed feedback signal appropriate for each speed range. Motor speed is determined by measuring the time periods between Hall transition events, and applicable Hall transition events are determined based on a current mode of the motor. Speed ranges (i.e., modes) include a low-speed mode, an intermediate-speed mode, and a high-speed mode, based on a current motor speed. The current motor speed is a previously calculated speed value that has been calculated and re-introduced into the system via a feedback loop. However, when the motor has recently been activated and no previous speed calculation has been performed, the current motor speed is an initial condition of zero. The speed determination system (see FIGS. 1-2) obtains an increased number of updates per motor revolution at low speeds, while obtaining fewer updates, and therefore generating less noise, at high speeds.

Figure 4:
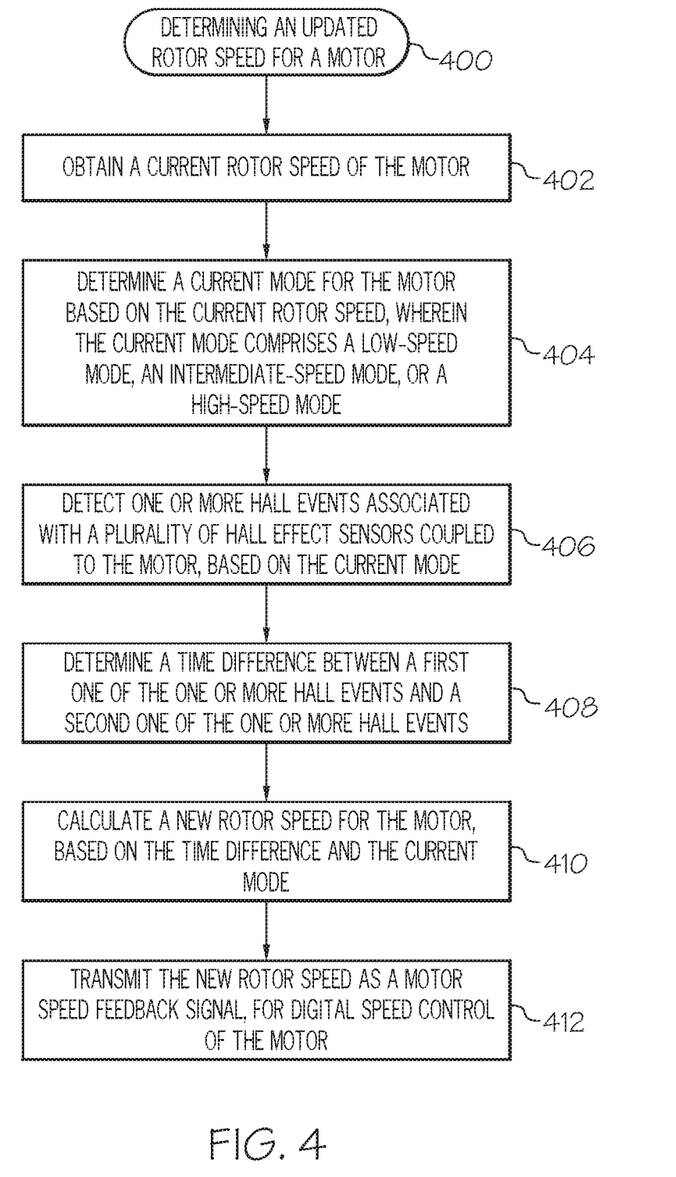
FIG. 4 is a flow chart that illustrates an embodiment of a process for determining an updated rotor speed for a motor.

FIG. 4 is a flow chart that illustrates an embodiment of a process 400 for determining an updated rotor speed for a motor. The various tasks performed in connection with process 400 may be performed by software, hardware, firmware, or any combination thereof. For illustrative purposes, the following description of process 400 may refer to elements mentioned above in connection with FIGS. 1-3. In practice, portions of process 400 may be performed by different elements of the described system. It should be appreciated that process 400 may include any number of additional or alternative tasks, the tasks shown in FIG. 4 need not be performed in the illustrated order, and process 400 may be incorporated into a more comprehensive procedure or process having additional functionality not described in detail herein. Moreover, one or more of the tasks shown in FIG. 4 could be omitted from an embodiment of the process 400 as long as the intended overall functionality remains intact.

For ease of description and clarity, it is assumed that the process 400 begins by obtaining a current rotor speed of the motor (step 402). When the motor has recently been activated and there is no calculated speed to obtain from the feedback loop, then the current rotor speed is an initial condition of zero. The current rotor speed is generally a calculated value, based on the current mode, that is calculated and re-introduced into the system via a feedback loop. In the exemplary embodiment described herein, the The process 400 also determines a current mode for the motor based on the current rotor speed, wherein the current mode comprises a low-speed mode, an intermediate-speed mode, or a high-speed mode (step 404). Here, the process 400 uses predetermined thresholds to identify the current mode. For example, motor speeds below a low-speed threshold may indicate a low-speed mode, motor speeds between the low-speed threshold and a high-speed threshold may indicate an intermediate-speed mode, and motor speeds above the high-speed threshold may indicate a high-speed mode. Any selected range of speeds may be used for each of the low-speed mode, intermediate-speed mode, and high-speed mode, and such ranges are generally selected and incorporated into the process 400 at design time, to accommodate noise requirements of the system.

Next, the process 400 detects one or more Hall events associated with a plurality of Hall Effect sensors coupled to the motor, based on the current mode (step 406). In certain embodiments, the process 400 detects polarity changes of rotor magnets of the motor, relative to the plurality of digital Hall Effect sensors during rotation of the motor, wherein the one or more Hall events comprises the polarity changes. This is described in more detail previously, with regard to FIG. 2. In some embodiments, however, the process 400 may detect and use any other transition or event that creates a change in the output of one of the Hall Effect sensors as the detected "Hall event".

When the motor is operating in a low-speed mode, the process 400 detects sequential Hall events occurring during a single electrical revolution of the motor. Referring back to the example of FIG. 3, the electrical revolution 312 includes six (6) Hall state changes 314, wherein each of the Hall state changes 314 indicate a motor electrical revolution of sixty degrees (60°) due to the number of Hall Effect sensors coupled to the motor. In other words, since there are three (3) Hall Effect sensors coupled to the motor, each of the Hall state changes 314 is associated with a sixty degree (60°) electrical revolution. Here, the Hall state changes 314 applicable to low-speed mode calculations include any two (2) sequential ones of the Hall state changes 314, in the electrical revolution 312. The number of electrical revolutions per mechanical revolution is equal to the number of magnet pole pairs divided by two (2). In this example, there are twenty-two (22) magnets (i.e., twenty-two (22) magnet pole pairs), and thus there are eleven (11) electrical revolutions per mechanical revolution.

Each sequential one of the Hall state changes 314 is associated with a different Hall Effect sensor. In this particular example, there are three (3) Hall Effect sensors: Hall Sensor A, Hall Sensor B, and Hall Sensor C. Throughout the electrical revolution 312 of the motor, the origin of each detected Hall state change 314 alternates through each of the three (3) Hall Effect sensors, in the same order. Here, Hall Sensor A produces the first and fourth of the Hall state changes 314, wherein the first is a rising-edge of the output voltage signal showing a transition from low (0V) to high (5V) for Hall Sensor A, and wherein the fourth is a falling-edge of the output voltage signal showing a transition from high (5V) to low (0V) for Hall Sensor A. Hall Sensor B produces the second and fifth of the Hall state changes 314, wherein the second is a falling-edge of the output voltage signal showing a transition from high (5V) to low (0V) for Hall Sensor B, and wherein the fifth is a rising-edge of the output voltage signal showing a transition from low (0V) to high (5V) for Hall Sensor B. Hall Sensor C produces the third and sixth of the Hall state changes 314, wherein the third is a rising-edge of the output voltage signal showing a transition from low (0V) to high (5V) for Hall Sensor C, and wherein the sixth is a falling-edge of the output voltage signal showing a transition from high (5V) to low (0V) for Hall Sensor C. Thus, for this configuration, there are six speed updates per electrical revolution 312.

Returning to FIG. 4, when the motor is operating in an intermediate-speed mode, the process 400 detects a first Hall event associated with a first rising edge associated with a first Hall Effect sensor, a second Hall event associated with a second rising edge associated with a second Hall Effect sensor, and a third Hall event associated with a third Hall Effect sensor. Here, in the intermediate-speed mode, the first Hall event (Hall event (1)), second Hall event (Hall event (2)), and the third Hall event (Hall event (3)) are produced by three different Hall Effect sensors, and represent the Hall events (1), (3), and (5) of the Hall state changes 314 (see FIG. 3). For example, the first Hall event may be the first one of the Hall state changes 314, which occurs and is detected during a first electrical revolution 312, wherein the first is a rising-edge of the output voltage signal showing a transition from low (0V) to high (5V) for Hall Sensor A. The second Hall event is the next-occurring rising-edge of the output voltage signal showing a transition from low (0V) to high (5V) for Hall Sensor B. The third Hall event is the next-occurring rising-edge of the output voltage signal showing a transition from low (0V) to high (5V) for Hall Sensor C. When the plot 300 is extended to show additional electrical revolutions, the first electrical revolution 312 and the output voltage signals produced during the first electrical revolution 312 are repeated. Thus, Hall event (1), Hall event (2), and Hall event (3), of the Hall state changes 314, are repeated during subsequent electrical revolutions. Here, there are fewer relevant Hall events than that detected in the low-speed mode, thus reducing signal noise during intermediate-level speeds of the motor.

Referring again to FIG. 4, when the motor is operating in a high-speed mode, the process 400 detects a first Hall event occurring during a first mechanical revolution and a second Hall event occurring during a second mechanical revolution of the motor. In the example described in FIG. 3, one (1) mechanical revolution of a twenty-two (22) pole motor coupled to three (3) Hall Effect sensors is associated with sixty-six (66) Hall state changes 314 and eleven (11) electrical revolutions. When operating in the high-speed mode, the first relevant Hall event is detected during a first mechanical revolution, and the remaining events of the first mechanical revolution are completed prior to detection of the second relevant Hall event which occurs during the next sequential mechanical revolution. For example, the first Hall event may be the first one of the Hall state changes 314, which occurs and is detected during a first mechanical revolution, wherein the first is a rising-edge of the output voltage signal showing a transition from low (0V) to high (5V) for Hall Sensor A. The second Hall event is another first one of the Hall state changes 314 after an entire mechanical revolution (i.e., eleven (11) electrical revolutions) has passed. The second Hall event is the next, first one of the Hall state changes 314, occurring eleven (11) electrical revolutions later, which is a rising-edge of the output voltage signal showing a transition from low (0V) to high (5V) for Hall Sensor A. Essentially, the first one of the Hall state changes is associated with one particular magnet rotating in front of, or passing in front of, one particular Hall Effect sensor. When the same particular magnet passes in front of the one particular Hall Effect sensor again, during the next sequential mechanical revolution, then the second Hall event occurs. When the plot 300 is extended to show additional electrical revolutions, the first electrical revolution 312 and the output voltage signals produced during the first electrical revolution 312 are repeated. Thus, first one of the Hall state changes 314 represents the first Hall event and the second Hall event. Here, in the high-speed mode, an entire mechanical revolution, which includes eleven (11) electrical revolutions 312, passes between relevant Hall events. There are fewer relevant Hall events than that detected in the intermediate-speed mode, resulting in a lower update rate. The signal noise is reduced due to reduced errors that were due to Hall Effect placement and/or manufacturing errors. The high-speed mode functions to remove electrical sampling errors thus reducing signal noise during high-level speeds of the motor. When operating in the high-speed mode, an entire mechanical revolution passes between relevant Hall events. The number of relevant Hall events is less than that detected in the intermediate-speed mode, thus reducing signal noise more than it is reduced during operation in the intermediate-speed mode.

Returning to FIG. 4, the process 400 then determines a time difference between a first one of the one or more Hall events and a second one of the one or more Hall events (step 408). In some embodiments, each Hall event may be associated with a time-stamp. In other embodiments, a processor or controller communicatively coupled to the Hall Effect sensors may detect and provide a time for each Hall event from an internal clock. The process 400 computes a time difference, using time-stamps or time-values associated with each Hall event.

Next, the process 400 calculates a new rotor speed for the motor, based on the time difference and the current mode (step 410). Here, calculating the new rotor speed for the motor further comprises dividing a change in position associated with the plurality of digital Hall Effect sensors by the time difference. Each digital Hall Effect sensor has a position (θ), and each distance value between two Hall Effect sensors is defined as Δθ. The position of each digital Hall Effect sensor (θ) and time values (based on timing information obtained in step 406) are known to the process 400. The new rotor speed may be calculated according to the following equation: $\omega = \Delta\theta/\Delta t$, where $\Delta t$ is the time difference between Hall events.

After calculating the new rotor speed for the motor (step 410), the process 400 transmits the new rotor speed as a motor speed feedback signal, for digital speed control of the motor (step 412). In certain embodiments, the process 400 transmits the motor speed feedback signal to a motor speed controller that operates to control the motor using the feedback signal. In some embodiments, the process 400 may transmit the motor speed feedback signal to another algorithm or process for performing telemetry operations. In some embodiments, the process 400 may transmit the motor speed feedback signal to other subsystems associated with the permanent magnet synchronous motor.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, or organic properties corresponding to the data bits. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

When implemented in software or firmware, various elements of the systems described herein are essentially the code segments or instructions that perform the various tasks. The program or code segments can be stored in a processor-readable medium or transmitted by a computer data signal embodied in a carrier wave over a transmission medium or communication path. The "computer-readable medium", "processor-readable medium", or "machine-readable medium" may include any medium that can store or transfer information. Examples of the processor-readable medium include an electronic circuit, a semiconductor memory device, a ROM, a flash memory, an erasable ROM (EROM), a floppy diskette, a CD-ROM, an optical disk, a hard disk, a fiber optic medium, a radio frequency (RF) link, or the like. The computer data signal may include any signal that can propagate over a transmission medium such as electronic network channels, optical fibers, air, electromagnetic paths, or RF links. The code segments may be downloaded via computer networks such as the Internet, an intranet, a LAN, or the like.

The following description refers to elements or nodes or features being "connected" or "coupled" together. As used herein, unless expressly stated otherwise, "coupled" means that one element/node/feature is directly or indirectly joined to (or directly or indirectly communicates with) another element/node/feature, and not necessarily mechanically. Likewise, unless expressly stated otherwise, "connected" means that one element/node/feature is directly joined to (or directly communicates with) another element/node/feature, and not necessarily mechanically. Thus, although the schematic shown in FIG. 1 depicts one exemplary arrangement of elements, additional intervening elements, devices, features, or components may be present in an embodiment of the depicted subject matter.

For the sake of brevity, conventional techniques related to signal processing, data transmission, signaling, network control, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Some of the functional units described in this specification have been referred to as "modules" in order to more particularly emphasize their implementation independence. For example, functionality referred to herein as a module may be implemented wholly, or partially, as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like. Modules may also be implemented in software for execution by various types of processors. An identified module of executable code may, for instance, comprise one or more physical or logical modules of computer instructions that may, for instance, be organized as an object, procedure, or function. Nevertheless, the executables of an identified module need not be physically located together, but may comprise disparate instructions stored in different locations that, when joined logically together, comprise the module and achieve the stated purpose for the module. Indeed, a module of executable code may be a single instruction, or many instructions, and may even be distributed over several different code segments, among different programs, and across several memory devices. Similarly, operational data may be embodied in any suitable form and organized within any suitable type of data structure. The operational data may be collected as a single data set, or may be distributed over different locations including over different storage devices, and may exist, at least partially, merely as electronic signals on a system or network.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for determining an updated rotor speed for a motor, the method comprising:
    obtaining, by a processor, a current rotor speed of the motor;
    determining a current mode for the motor, based on the current rotor speed, wherein the current mode comprises a low-speed mode, an intermediate speed mode, or a high-speed mode;
    detecting, based on the current mode, one or more Hall events associated with a plurality of digital Hall Effect sensors coupled to the motor;
    calculating, by the processor, a new rotor speed for the motor, based on the one or more Hall events and the current mode; and
    transmitting the new rotor speed as a motor speed feedback signal, for digital speed control of the motor.

2. The method of claim 1, further comprising:
    detecting a time difference between a first one of the one or more Hall events and a second one of the one or more Hall events;
    wherein the first one and the second one are detected by one of the plurality of digital Hall effect sensors; and
    wherein calculating the new rotor speed for the motor further comprises dividing a change in position associated with the plurality of digital Hall Effect sensors by the time difference.

3. The method of claim 2, wherein, when the current mode comprises the low-speed mode, the first one and the second one comprise sequential Hall events during a single electrical revolution of the motor.

4. The method of claim 2, wherein, when the current mode comprises the intermediate-speed mode, the first one is associated with a first electrical revolution and the second one is associated with a second electrical revolution.

5. The method of claim 2, wherein, when the current mode comprises the high-speed mode, the first one occurs during a first mechanical revolution and the second one occurs during a second mechanical revolution of the motor.

6. The method of claim 1, further comprising:
    detecting polarity changes of rotor magnets of the motor, relative to the plurality of digital Hall effect sensors during rotation of the motor, wherein the one or more Hall events comprises the polarity changes;
    wherein the new rotor speed for the motor is calculated based on the current mode and the polarity changes.

7. The method of claim 6, further comprising:
    when the current mode comprises the low-speed mode, detecting a time difference between a first one of the polarity changes and a second one of the polarity changes, wherein the first one and the second one comprise sequential polarity changes during a single electrical revolution of the motor; and
    calculating the new rotor speed for the motor based on the current mode and the time difference.

8. The method of claim 6, further comprising:
    when the current mode comprises the intermediate-speed mode, detecting a time difference between a first one of the polarity changes and a second one of the polarity changes, wherein the first one is associated with a first electrical revolution and wherein the second one is associated with a second electrical revolution; and
    calculating the new rotor speed for the motor based on the current mode and the time difference.

9. The method of claim 6, further comprising:
    when the current mode comprises the high-speed mode, detecting a time difference between a first one of the polarity changes and a second one of the polarity changes, wherein the first one occurs during a first mechanical revolution and wherein the second one occurs during a second mechanical revolution of the motor; and calculating the new rotor speed for the motor based on the current mode and the time difference.

10. A system for determining an updated rotor speed for a motor, the motor comprising a permanent magnet synchronous motor comprising rotor magnets, the system comprising:
a system memory element;
a plurality of digital Hall effect sensors, configured to detect one or more Hall events associated with the plurality of digital Hall effect sensors during rotation of the motor; and
at least one processor, communicatively coupled to the system memory element and the plurality of Hall effect sensors, the at least one processor configured to:
obtain a current rotor speed of the motor;
determine a current mode for the motor, based on the current rotor speed, wherein the current mode comprises a low-speed mode, an intermediate speed mode, or a high-speed mode;
detect, based on the current mode, the one or more Hall events, via the plurality of digital Hall Effect sensors;
calculate a new rotor speed for the motor, based on the one or more Hall events and the current mode; and
transmit the new rotor speed as a motor speed feedback signal, for digital speed control of the motor.

11. The system of claim 10, wherein the at least one processor is further configured to:
detect a time difference between a first one of the one or more Hall events and a second one of the one or more Hall events; and
calculate the new rotor speed for the motor further by dividing a change in position associated with the plurality of digital Hall Effect sensors by the time difference.

12. The system of claim 11, wherein, when the current mode comprises the low-speed mode, the first one and the second one comprise sequential Hall events during a single electrical revolution of the motor.

13. The system of claim 11, wherein, when the current mode comprises the intermediate-speed mode, the first one is associated with a first electrical revolution and the second one is associated with a second electrical revolution.

14. The system of claim 11, wherein, when the current mode comprises the high-speed mode, the first one occurs during a first mechanical revolution and the second one occurs during a second mechanical revolution of the motor; and
wherein the first one and the second one are generated by one of the rotor magnets.

15. The system of claim 10, wherein the at least one processor is further configured to:
detect polarity changes of rotor magnets of the motor, relative to the plurality of digital Hall effect sensors during rotation of the motor, wherein the one or more Hall events comprises the polarity changes; and
calculate the new rotor speed for the motor based on the current mode and the polarity changes.

16. A non-transitory, computer-readable medium containing instructions thereon, which, when executed by a processor, perform a method comprising:
determining a current mode for a motor, based on a current rotor speed, wherein the current mode comprises a low-speed mode, an intermediate speed mode, or a high-speed mode, and wherein the motor comprises a currently rotating permanent magnet synchronous motor;
detecting one or more polarity changes associated with a plurality of digital Hall Effect sensors coupled to the motor, based on the current mode;
calculating a new rotor speed for the motor, based on the one or more polarity changes and the current mode; and
transmitting the new rotor speed as a motor speed feedback signal, for digital speed control of the motor.

17. The non-transitory, computer-readable medium of claim 16, wherein the method further comprises:
detecting a time difference between a first one of the one or more polarity changes and a second one of the one or more polarity changes;
wherein the first one and the second one are detected by one of the plurality of digital Hall effect sensors; and
calculating the new rotor speed for the motor further by dividing a change in position associated with the plurality of digital Hall Effect sensors by the time difference.

18. The non-transitory, computer-readable medium of claim 17, wherein, when the current mode comprises the low-speed mode, the first one and the second one comprise sequential Hall events during a single electrical revolution of the motor.

19. The non-transitory, computer-readable medium of claim 17, wherein, when the current mode comprises the intermediate-speed mode, the first one is associated with a first electrical revolution and the second one is associated with a second electrical revolution.

20. The non-transitory, computer-readable medium of claim 16, wherein, when the current mode comprises the high-speed mode, the first one occurs during a first mechanical revolution and the second one occurs during a second mechanical revolution of the motor.

* * * * *